United States Patent
Kang et al.

(10) Patent No.: US 7,545,403 B2
(45) Date of Patent: Jun. 9, 2009

(54) OPTICAL SYSTEM HAVING IMAGE DIRECTION MODULATOR AND LITI APPARATUS INCLUDING THE SYSTEM

(75) Inventors: Tae-Min Kang, Suwon-si (KR); Myung-Won Song, Suwon-si (KR); Jae-Ho Lee, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 309 days.

(21) Appl. No.: 11/251,851

(22) Filed: Oct. 18, 2005

(65) Prior Publication Data

US 2006/0087550 A1    Apr. 27, 2006

(30) Foreign Application Priority Data

Oct. 26, 2004    (KR) .................... 10-2004-0085972

(51) Int. Cl.
*B41J 15/14*    (2006.01)
*B41J 27/00*    (2006.01)
(52) U.S. Cl. ...................... 347/241; 347/256
(58) Field of Classification Search ............. 347/243, 347/260, 263, 248, 256, 215, 220, 230, 241, 347/242, 257; 720/618; 355/40
See application file for complete search history.

(56) References Cited

U.S. PATENT DOCUMENTS

| | | | | |
|---|---|---|---|---|
| 5,105,215 A | * | 4/1992 | Liu | 355/40 |
| 5,189,661 A | * | 2/1993 | Honda et al. | 720/618 |
| 6,458,504 B2 | * | 10/2002 | Wachi et al. | 430/200 |
| 6,577,429 B1 | * | 6/2003 | Kurtz et al. | 359/279 |
| 6,720,524 B1 | * | 4/2004 | Hamada | 219/121.7 |
| 6,900,918 B2 | * | 5/2005 | Orcutt et al. | 359/224 |
| 7,148,957 B2 | * | 12/2006 | Tolbert et al. | 355/67 |
| 2002/0167584 A1 | * | 11/2002 | Zelenka | 347/234 |
| 2004/0164057 A1 | * | 8/2004 | Edme et al. | 219/121.7 |

* cited by examiner

*Primary Examiner*—Hai C Pham
(74) *Attorney, Agent, or Firm*—Robert E. Bushnell, Esq.

(57) ABSTRACT

An optical system has an image direction modulator and a laser induced thermal imaging (LITI) apparatus includes the optical system. The optical system includes a laser source for producing laser beams, and the image direction modulator has a first mode in which an image direction of the laser beams is modulated relative to a first direction and a second mode in which the image direction of the laser beams is modulated relative to a second direction.

19 Claims, 13 Drawing Sheets

OPTICAL SYSTEM HAVING IMAGE DIRECTION MODULATOR AND LITI APPARATUS INCLUDING THE SYSTEM

CLAIM OF PRIORITY

This application makes reference to, incorporates herein, and claims all benefits accruing under 35 U.S.C. § 119 from an application for OPTICAL SYSTEM HAVING IMAGE DIRECTION MODULATOR AND LITI APPARATUS INCLUDING THE OPTICAL SYSTEM earlier filed in the Korean Intellectual Property Office on the 26 of October, 2004 and there duly assigned Serial No. 10-2004-0085972.

BACKGROUND OF THE INVENTION

1. Technical Field

The present invention relates to an optical system and a laser induced thermal imaging (LITI) apparatus including the same and, more particularly, to an optical system having an image direction modulator and an LITI apparatus including the system.

2. Related Art

Presently, the flat panel display (FPD) is on the rise as a display that replaces the cathode-ray tube (CRT) display because the FPD is lightweight and ultrathin. Typical examples of the FPD are a liquid crystal display (LCD) and an organic light emitting display (OLED). In comparison with the LCD, the OLED has high brightness and a wide viewing angle, and is easily implemented as an ultra-thin display because it needs no backlight.

Such an FPD includes red (R), green (G), and blue (B) pixels to realize full color. Specifically, the LCD includes R, G, and B color filters to realize full color, whereas the OLED includes R, G, and B emission layers to realize full color.

In the OLED, the R, G, and B emission layers may be formed by a laser induced thermal imaging (LITI) method. The LITI method enables fine patterning of the emission layers compared to a deposition method using a shadow mask. Also, the LITI method is advantageously a dry process, unlike an inkjet printing method.

The LITI method requires a donor film including a base film, a light-to-heat conversion (LTHC) layer, and a transfer layer. Thus, laser beams are irradiated onto the base film of the donor film so that the transfer layer is transferred onto an acceptor substrate to form an emission layer pattern. In this case, the emission layer pattern may have a stripe shape. The stripe-shaped emission layer pattern may be obtained by scanning laser beams onto the base film in a lengthwise direction relative to the emission layer pattern. In this case, the laser beams irradiated on the base film have an image which is fixed around an X-axis or Y-axis depending on the type of LITI apparatus. The lengthwise direction of the emission layer pattern depends on a direction of the image of the laser beams.

Meanwhile, whether the lengthwise direction of the emission layer pattern should be parallel to the X-axis or the Y-axis direction is determined according to the type of OLED. Accordingly, there is a problem in that a certain type of LITI apparatus must be used according to the lengthwise direction of the emission layer pattern.

SUMMARY OF THE INVENTION

The present invention, provides an optical system which modulates an image direction of laser beams using a comparatively simple method without exchanging or changing equipment.

In addition, the present invention provides a laser induced thermal imaging (LITI) apparatus which enables the formation of transfer layer patterns arranged in different directions without exchanging or changing equipment.

In an exemplary embodiment of the present invention, an optical system includes: a laser source for producing laser beams; and an image direction modulator having a first mode in which an image direction of the laser beams is modulated relative to a first direction and a second mode in which the image direction of the laser beams is modulated relative to a second direction.

In another exemplary embodiment of the present invention, an LITI apparatus includes an optical system. The optical system includes a laser source for producing laser beams, an image direction modulator for modulating an image direction of the laser beams, and a projection lens. A chuck is disposed under the optical system in order to mount a substrate.

In the optical system, the first direction may be an X-axis direction, and the second direction may be a Y-axis direction. The image direction modulator includes a first beam passage as the first mode and a second beam passage as the second mode, and preferably each of the first and second beam passages comprises reflecting mirrors.

The optical system further includes an image transformer disposed between the laser source and the image direction modulator. The image transformer is used to transform an image of the laser beams produced from the laser source into a line shape. The image transformer may be a homogenizer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
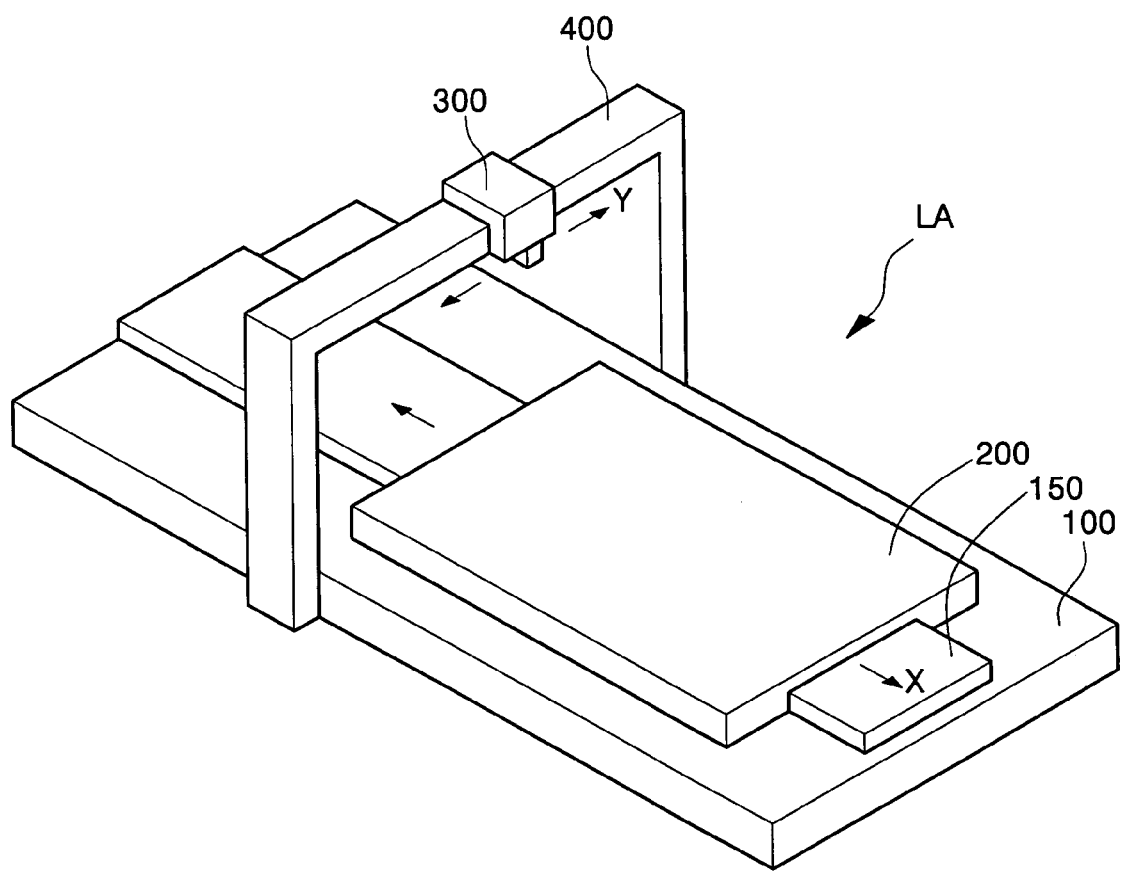
FIG. 1 is a schematic perspective view of a laser induced thermal imaging (LITI) apparatus according to an exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. It will also be understood that when a layer is referred to as being "on" another layer or substrate, it may be directly on the other layer or substrate, or intervening layers may also be present. The same reference numerals are used to denote the same elements throughout the specification.

FIG. 1 is a schematic perspective view of a laser induced thermal imaging (LITI) apparatus according to an exemplary embodiment of the present invention.

Referring to FIG. 1, the LITI apparatus LA includes a stage 100. A chuck 200 is disposed on the stage 100. Also, the stage 100 includes a chuck guide bar 150 for allowing the chuck 200 to reciprocate in an X-axis direction.

An optical system 300 is disposed over the chuck 200 and is mounted on an optical system guide bar 400. The optical system 300 is movable along the optical system guide bar 400 in a Y-axis direction.

Figure 2:
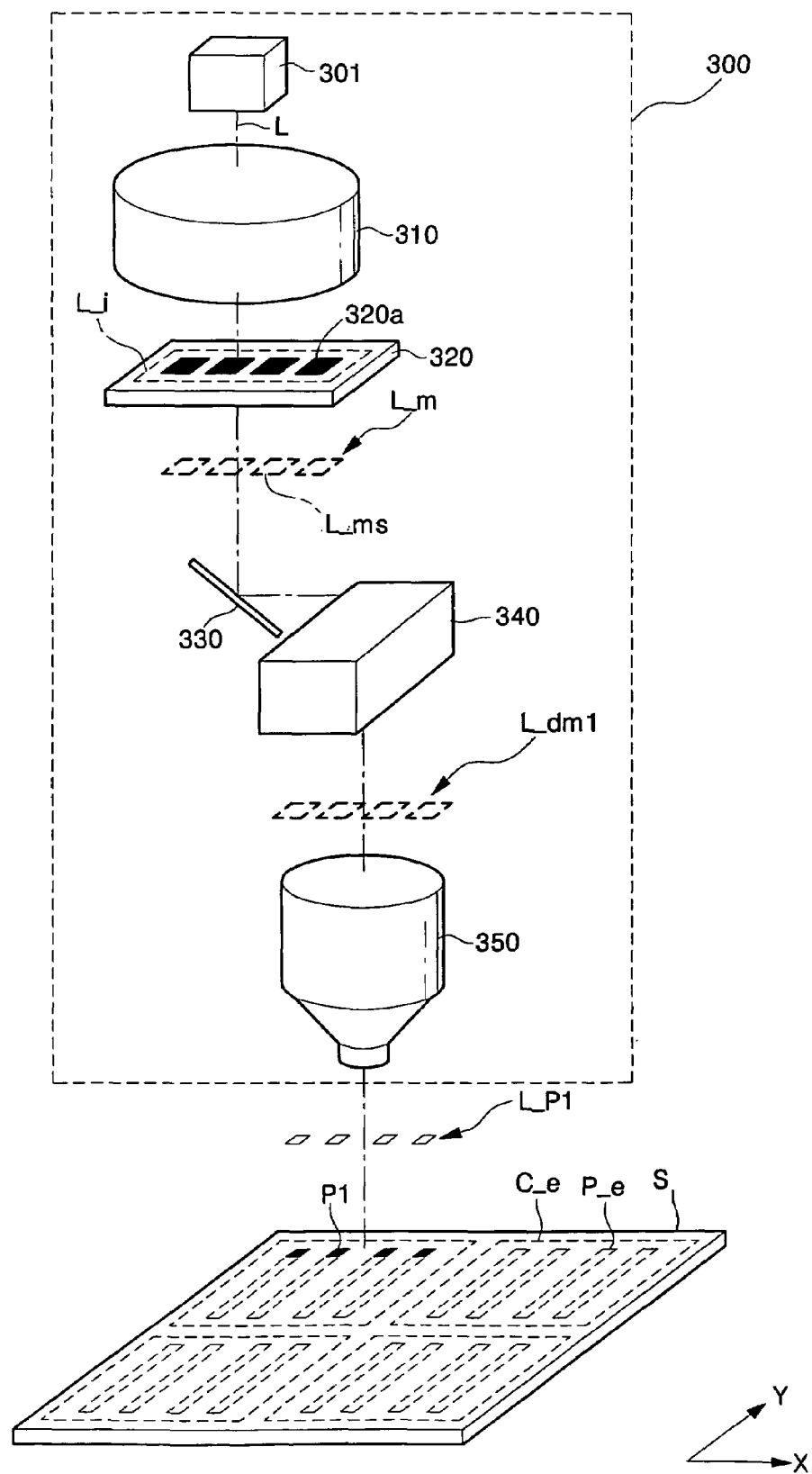
FIGS. 2 and 4 are schematic diagrams of an optical system of FIG. 1 according to an exemplary embodiment of the present invention.
Figure 4:
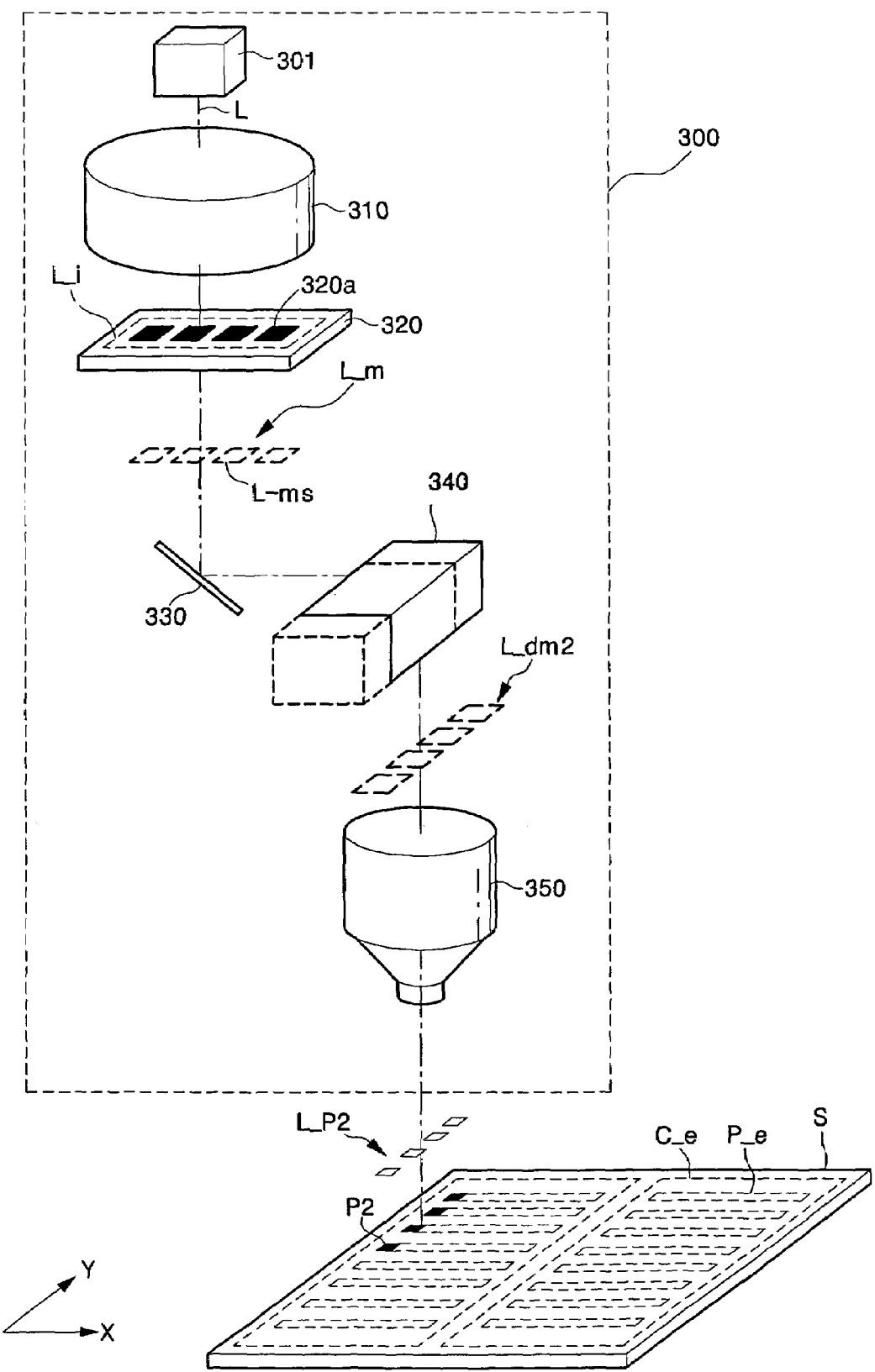

FIGS. 2 and 4 are schematic diagrams of the optical system of FIG. 1 according to an exemplary embodiment of the present invention.

Referring to FIGS. 2 and 4, the optical system 300 includes a laser source 301, an image transformer 310, a mask 320, an image direction modulator 340, and a projection lens 350.

The laser source 301 is used to produce laser beams L.

Laser beams L produced by the laser source 301 pass through the image transformer 310. The image transformer 310 is used to transform an image of the laser beams L, produced by the laser source 301, into a line shape. The laser beams L that pass through the image transformer 310 have a line-shaped image L_i. A lengthwise direction of the line-shaped image L_i may be parallel to the X-axis direction. Throughout the present specification, "image" refers to a region in which beams are actually irradiated when the beams are irradiated on the surface of an object to be processed. Also, "line shape" refers not only to a line shape in the strict sense, but also to a rectangular shape having a high aspect ratio.

The image transformer 310 may be a homogenizer. The homogenizer transforms an image of laser beams into a line shape, and also transforms a Gaussian profile of the laser beams produced by the laser source 301 into a uniform flat-top profile.

The laser beams, which have the line-shaped image L_i after passing through the image transformer 310, pass through the mask 320. The mask 320 includes at least one light transmission pattern or at least one light reflection pattern. Although only light transmission patterns 320a are exemplarily illustrated in FIG. 2, the present invention is not limited thereto. The laser beams that pass through the mask 320 may have a patterned image L_m due to a pattern of the mask 320. The patterned image L_m includes sub patterns L_ms.

The optical transmission patterns 320a may be arranged inside the line-shaped image L_i of the laser beams, and are preferably arranged in a row in the lengthwise direction of the line-shaped image L_i (i.e., in the X-axis direction). As a result, a plurality of sub patterns L_ms arranged in the X-axis direction are formed. Thus, during a subsequent beam scanning process, a plurality of patterns may be simultaneously formed through a one-time scanning operation. In this case, the direction in which the laser beams are scanned may be restricted to a direction (i.e., the Y-axis direction) orthogonal to the lengthwise direction (i.e., the X-axis direction) of the patterned image L_m. However, the restriction as to the direction in which the laser beams are scanned may be overcome using the image direction modulator 340, which will now be described.

The laser beams having the patterned image L_m are incident on the image direction modulator 340 which modulates an image direction of the laser beams. The laser beams having the patterned image L_m may be incident on the image direction modulator 340 through a reflecting mirror 330. The image direction modulator 340 includes a first mode in which the image direction of the laser beams is modulated relative to a first direction and a second mode in which the image direction of the laser beams is modulated relative to a second direction. In this regard, the first direction may be the X-axis direction, while the second direction may be the Y-axis direction. FIG. 2 shows a case where the image direction modulator 340 operates in the first mode, and FIG. 4 shows a case where the image direction modulator 340 operates in the second mode.

The laser beams outputted from the image direction modulator 340 pass through the projection lens 350, are outputted from the optical system 300, and are irradiated onto a substrate S. The projection lens 350 does not affect the image direction of the laser beams.

When the image direction modulator 340 operates in the first mode as shown in FIG. 2, a lengthwise direction of an image L_dm1 of the laser beams that pass through the image direction modulator 340 is modulated relative to the X-axis direction. Specifically, the direction of the image L_dm1 of the laser beams that pass through the image direction modulator 340 is parallel to the direction of the patterned image L_m of the laser beams that pass through the mask 320. Also, a direction of an image L_p1 of the laser beams irradiated onto the substrate S is parallel to the direction of the patterned image L_m of the laser beams that pass through the mask 320. As a result, a pattern P1 is formed on the substrate S in the same direction as the patterned image L_m of the laser beams that pass through the mask 320.

In another case, when the image direction modulator 340 operates in the second mode as shown in FIG. 4, a lengthwise direction of an image L_dm2 of the laser beams that pass through the image direction modulator 340 is modulated relative to the Y-axis direction. Specifically, the direction of the image L_dm2 of the laser beams that pass through the image direction modulator 340 is orthogonal to the direction of the patterned image L_m of the laser beams that pass through the mask 320. Also, a direction of an image L_p2 of the laser beams irradiated onto the substrate S is orthogonal to the direction of the patterned image L_m of the laser beams that pass through the mask 320. As a result, a pattern P2 is formed on the substrate S in a vertical direction relative to the patterned image L_m of the laser beams that pass through the mask 320. The conversion of the image direction modulator 340 from the first mode to the second mode is enabled by moving the image direction modulator 340 in the Y-axis direction by a predetermined distance.

As described above, the optical system 300 adopts the image direction modulator 340, which may modulate an image direction of incident beams to different directions and then output the beams, so that the image direction of the laser beams produced by the optical system 300 may be modulated using a simple method without exchanging or changing optical systems.

Figure 3:
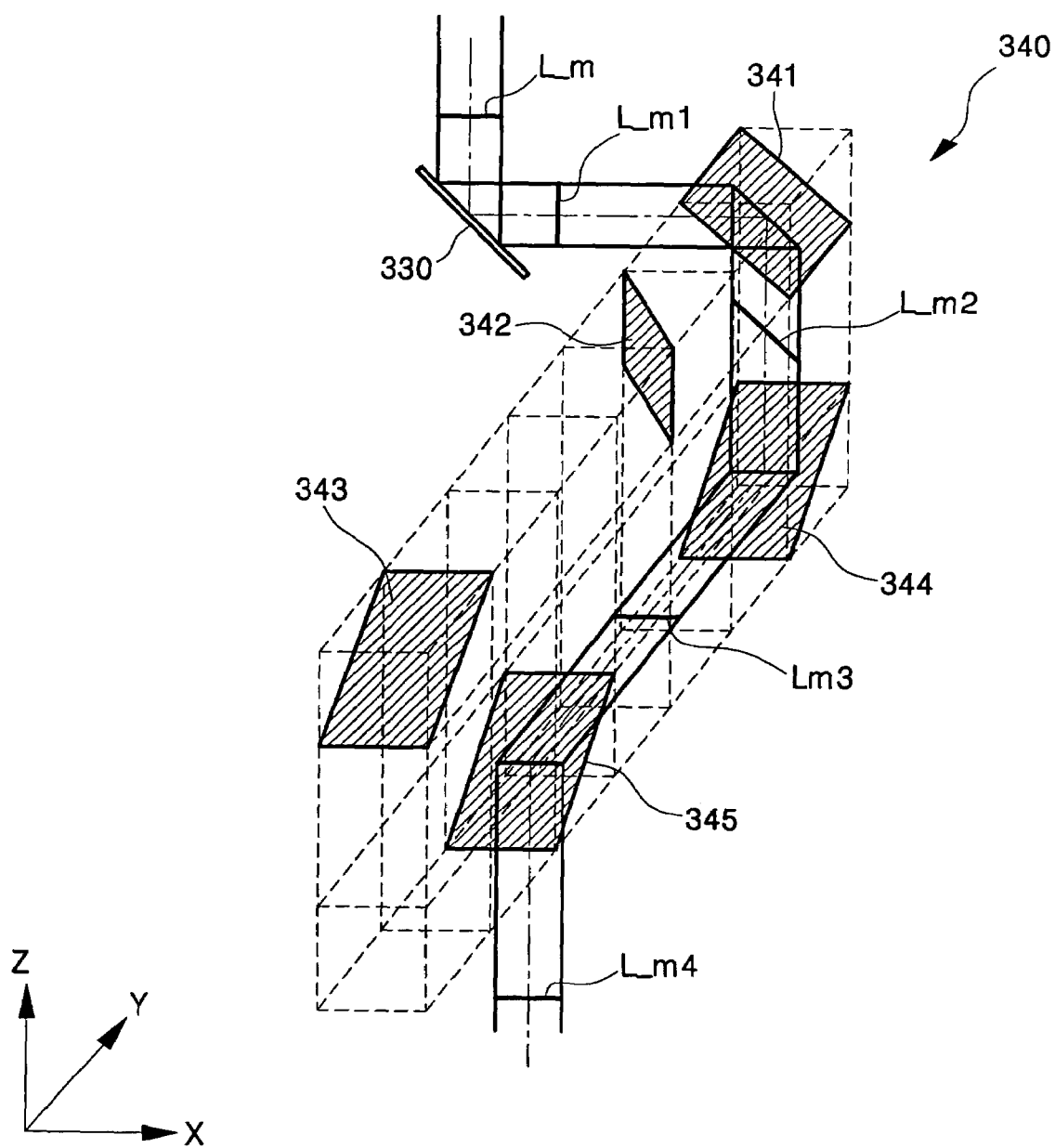
FIGS. 3 and 5 are diagrams of image direction modulators of FIGS. 2 and 4, respectively, according to an exemplary embodiment of the present invention.
Figure 5:
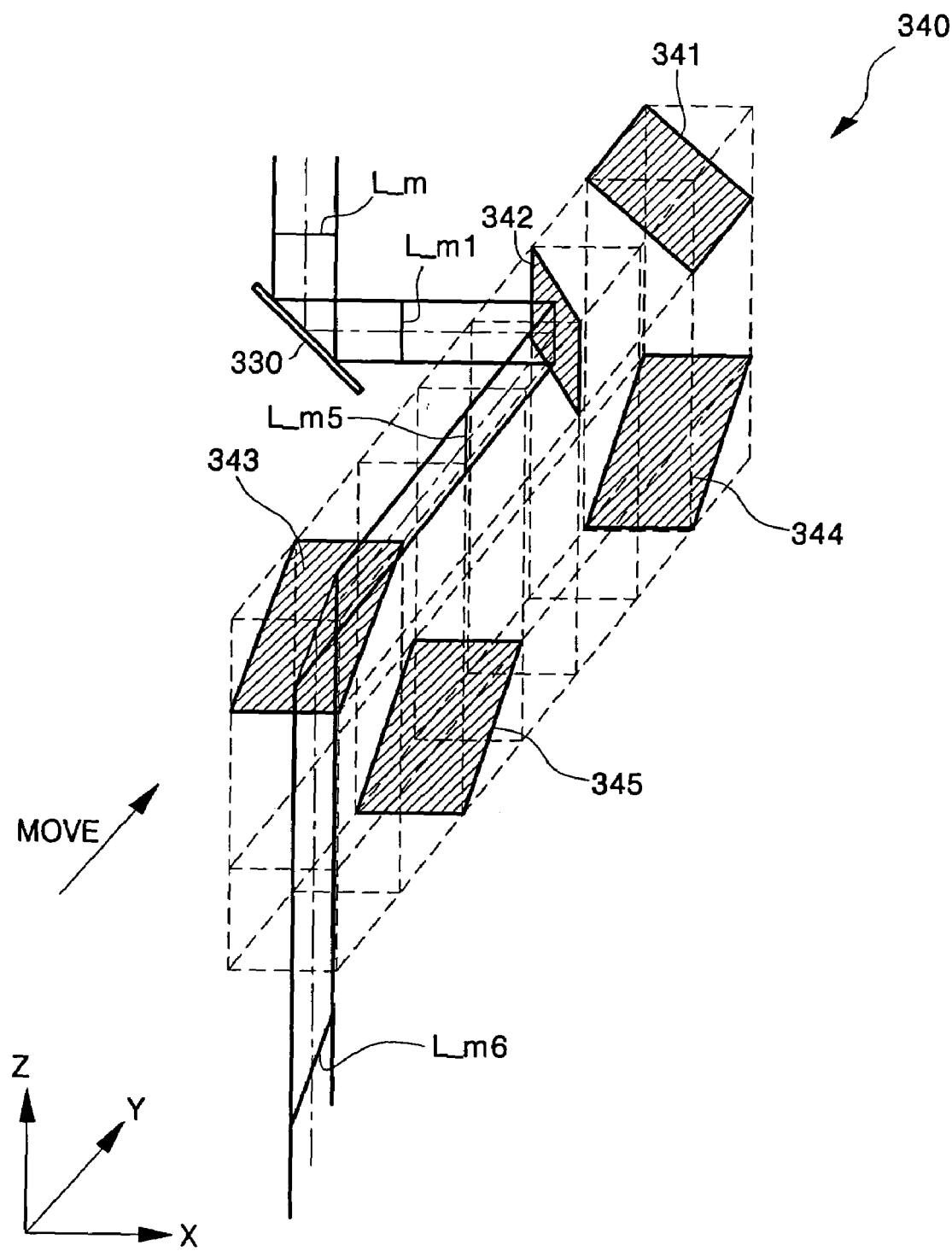

FIGS. 3 and 5 are diagrams of image direction modulators of FIGS. 2 and 4, respectively, according to an exemplary embodiment of the present invention. FIG. 3 shows a case where the image direction modulator 340 operates in the first mode, and FIG. 5 shows a case where the image direction modulator 340 operates in the second mode.

Referring to FIGS. 3 and 5, the image direction modulator 340 includes first through fifth reflecting mirrors 341, 342, 343, 344, and 345. The first through third reflecting mirrors 341, 342, and 343 are disposed on a first level, and the fourth and fifth reflecting mirrors 344 and 345 are disposed on a second level, which is spaced a predetermined distance apart from the first level. Also, the first and fourth reflecting mirrors 341 and 344 are disposed on the same Z-axis. A distance between the first reflecting mirror 341 and the second reflecting mirror 342 on the Y-axis is equal to a distance between the fifth reflecting mirror 345 and the third reflecting mirror 343 on the Y-axis. Here, "distance" refers to a distance measured between central points of two reflecting mirrors.

In order to shorten the passage of beams that pass through the image direction modulator 340, each of the first through fifth reflecting mirrors 341, 342, 343, 344, and 345, respectively, may be disposed such that a beam incident on a reflection surface makes an angle of 90° with a reflected beam. Thus, each of the first through fifth reflecting mirrors 341, 342, 343, 344, and 345, respectively, may be disposed such that its two opposing sides are in contact with two opposing corners of a virtual regular hexahedron, respectively. Specifically, a reflection surface of the first reflecting mirror 341 satisfies a plane equation of $x+z=c$, a reflection surface of the second reflecting mirror 342 satisfies a plane equation of $x+y=c$, a reflection surface of the third reflecting mirror 343 satisfies a plane equation of $y+z=c$, and each of reflection surfaces of the fourth and fifth reflecting mirrors 344 and 345, respectively, satisfies a plane equation of $y+z=c$.

The first mode of the image direction modulator 340 will be described with reference to FIG. 3.

Laser beams that have a patterned image L_m after passing through the mask 320 of FIG. 2 proceed in the X-axis direction through the reflecting mirror 333, and are then incident on the image direction modulator 340. In this case, the laser beams patterned through the mask 320 have an X-axis image L_m, while the laser beams transmitted through the reflecting mirror 330 have a Y-axis image L_m1. The laser beams incident on the image direction modulator 340 are reflected by the first reflecting mirror 341 so that the laser beams turn to a −Z-axis direction and have an image L_m2 that is sloped at an angle of −45° about the Y-axis. Thereafter, the laser beams reflected by the first reflecting mirror 341 are incident on the fourth reflecting mirror 344, and are reflected by the fourth reflecting mirror 344. Thus, the laser beams turn to a −Y-axis direction and have an X-axis image L_m3. After that, the laser beams reflected by the fourth reflecting mirror 344 are incident on the fifth reflecting mirror 345, and are reflected by the fifth reflecting mirror 345. Thus, the laser beams turn to the −Z-axis direction and are outputted from the image direction modulator 340. The laser beams outputted from the image direction modulator 340 have an X-axis image L_m4.

As a result, the direction of the patterned image L_m of the laser beams that pass through the mask 320 may be parallel to the direction of the image L_m4 of the laser beams outputted from the image direction modulator 340.

In another case, the second mode of the image direction modulator 340 will be described with reference to FIG. 5.

Laser beams that have a patterned image L_m after passing through the mask 320 of FIG. 2 proceed in the X-axis direction through the reflecting mirror 330, and are incident on the image direction modulator 340. In this case, the laser beams patterned through the mask 320 have the X-axis image L_m, while the laser beams transmitted through the reflecting mirror 330 have the Y-axis image L_m1.

In this case, the conversion of the image direction modulator 340 from the first mode into the second mode is enabled by moving the image direction modulator 340 by a predetermined distance in the Y-axis direction. The distance through which the image direction modulator 340 is moved is equal to the distance between the first and second reflecting mirrors 341 and 342, respectively, on the Y-axis.

Accordingly, the laser beams incident on the image direction modulator 340 are incident on the second reflecting mirror 342. Thus, the laser beams incident on the second reflecting mirror 342 are reflected by the second reflected mirror 342 so that they turn to the −Y-axis direction and have a Z-axis image L_m5. After that, the laser beams which turn to the −Y-axis direction are incident on the third reflecting mirror 343, and are then reflected by the third reflecting mirror 343. Thus, they turn to the −Z-axis direction, and are outputted from the image direction modulator 340. The laser beams outputted from the image direction modulator 340 have a Y-axis image L_m6.

As a result, the direction of the patterned image L_m of the laser beams that pass through the mask 320 may be orthogonal to the direction of the image L_m6 of the laser beams output from the image direction modulator 340.

As stated above, the first mode of the image direction modulator 340 may be implemented by a first beam passage which is comprises the first, fourth, and fifth reflecting mirrors 341, 344, and 345, respectively, whereas the second mode of the image direction modulator 340 may be implemented by a second beam passage which comprises the second and third reflecting mirrors 342 and 343, respectively. However, the first and second modes of the image direction modulator 340, which modulate the image direction of laser beams relative to different directions from each other, are not limited to the above-described beam passages but may be embodied as other shapes. Also, the first and second beam passages may comprise elements other than the first through fifth reflecting mirrors 341, 342, 343, 344, and 345, respectively.

Meanwhile, the image direction modulator 340 is converted from the first mode to the second mode by moving the image direction modulator 340 through the distance between the first and second reflecting mirrors 341 and 342, respectively, in the Y-axis direction. Thus, in order to perform the second mode, it is not necessary to shift the position of the laser beams incident on the image direction modulator 340. In addition, since the distance between the fifth and third reflecting mirrors 345 and 343, respectively, on the Y-axis is equal to the distance between the first and second reflecting mirrors 341 and 342, respectively, on the Y-axis, the position of the laser beams outputted from the image direction modulator 340 is the same irrespective of the mode of the image direction modulator 340. In conclusion, the image direction modulator 340 may operate in either the first mode or the second mode by merely moving the image direction modulator 340 by a predetermined distance while fixing other units.

Figure 6:
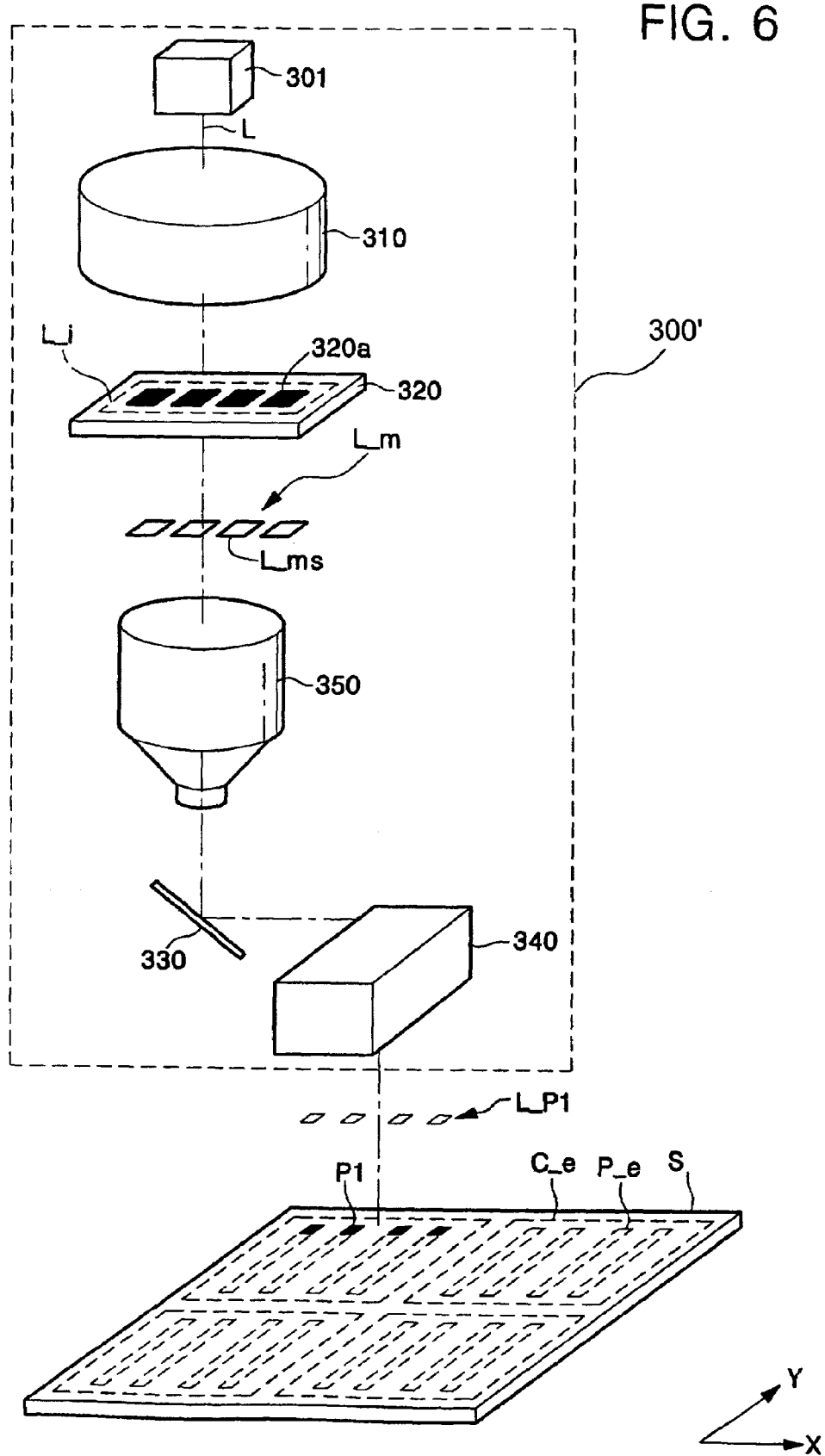
FIG. 6 is a schematic diagram of the optical system of FIG. 1 according to another exemplary embodiment of the present invention.

FIG. 6 is a schematic diagram of the optical system of FIG. 1 according to another exemplary embodiment of the present invention.

Referring to FIG. 6, the construction of the optical system 300' in the present embodiment is the same as the optical system 300 described with reference to FIG. 2 except that a projection lens 350 is disposed between a mask 320 and a reflecting mirror 330 associated with an image direction modulator 340.

Figure 7A:
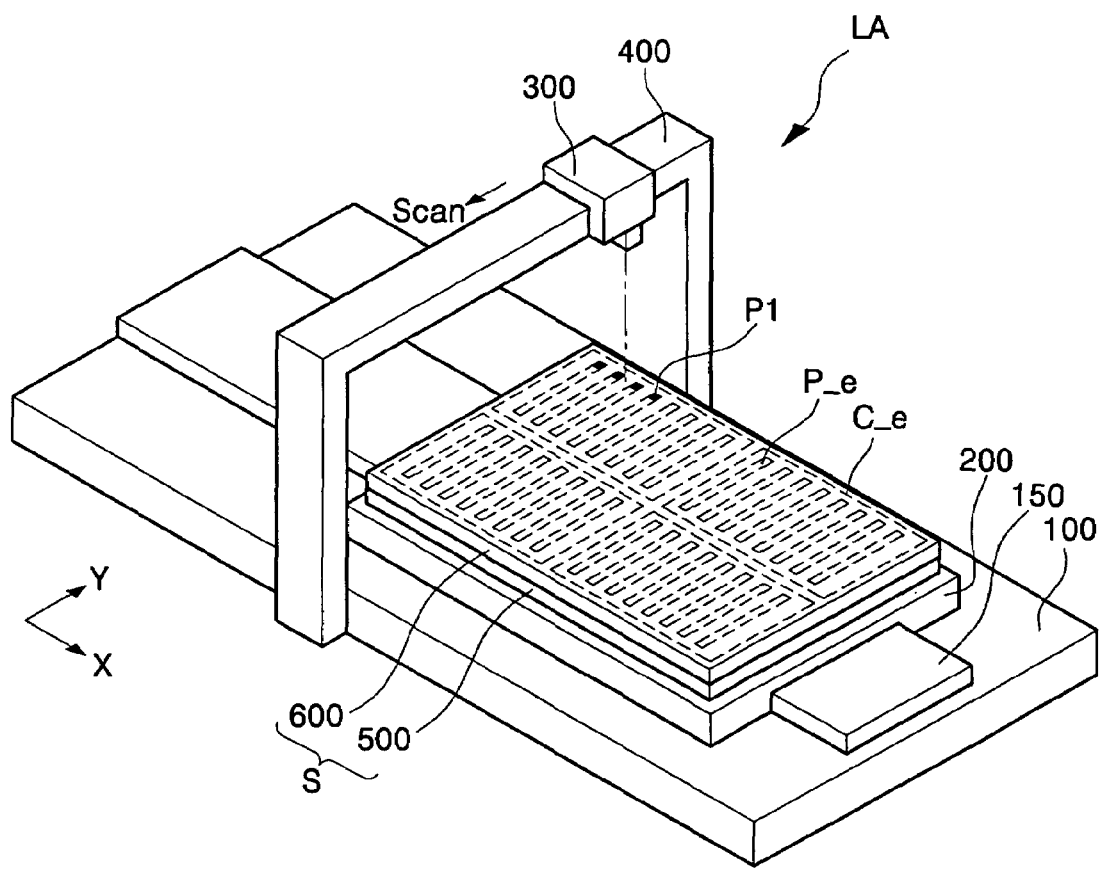
FIGS. 7A, 7B and 7C are perspective views illustrating a method of fabricating an organic light emitting display (OLED) using the LITI apparatus of FIG. 1.
Figure 7B:
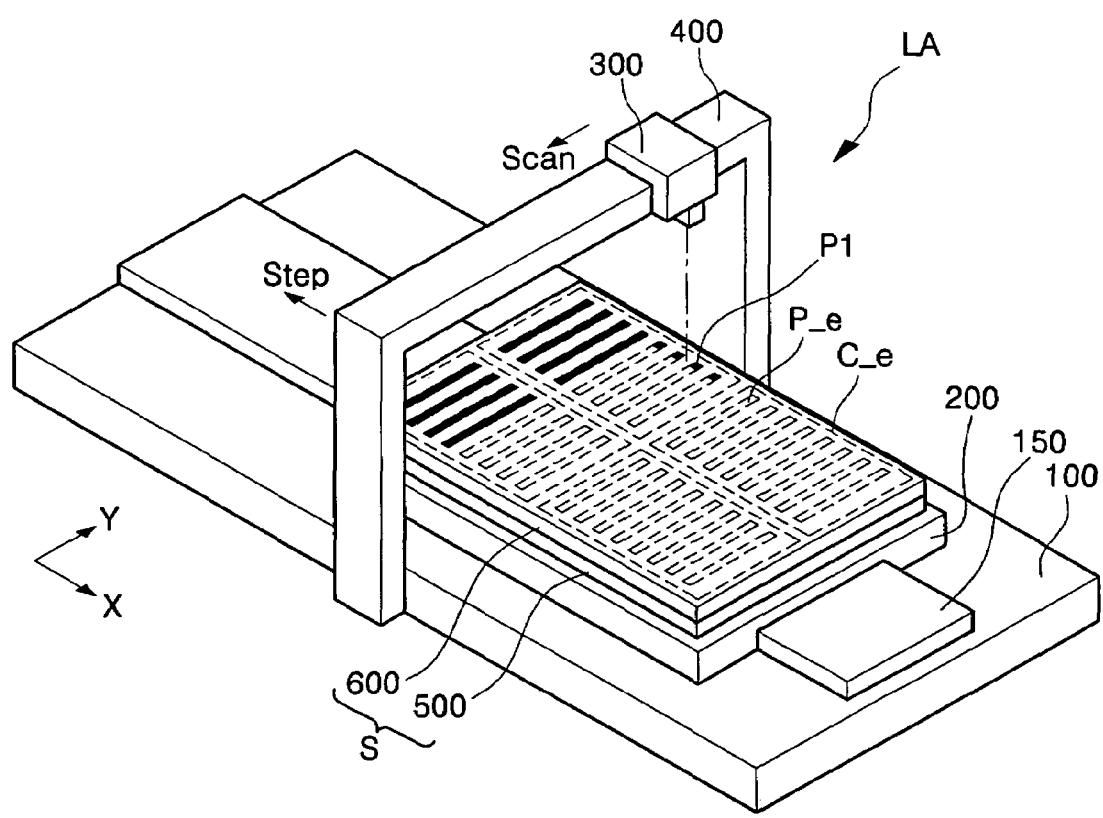
Figure 7C:
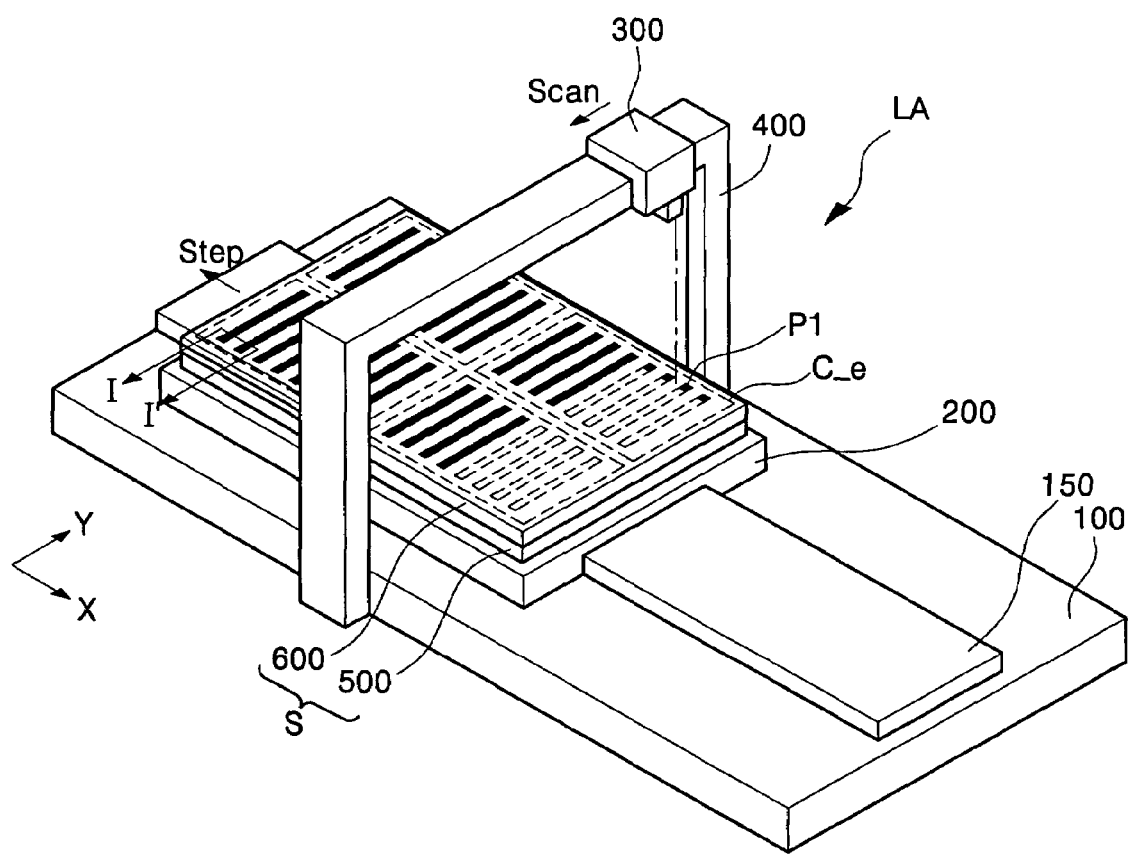
Figure 8A:
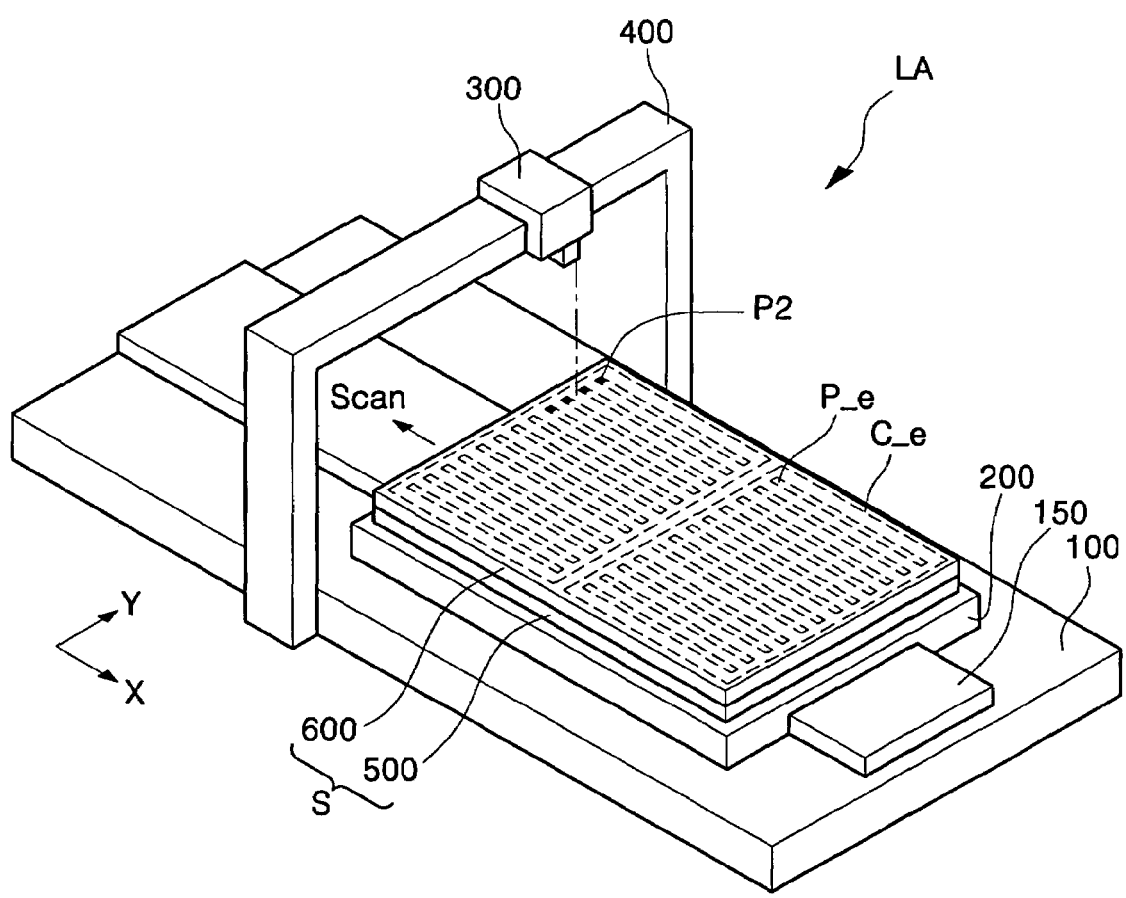
FIGS. 8A, 8B and 8C are perspective views illustrating another method of fabricating an OLED using the LITI apparatus of FIG. 1.
Figure 8B:
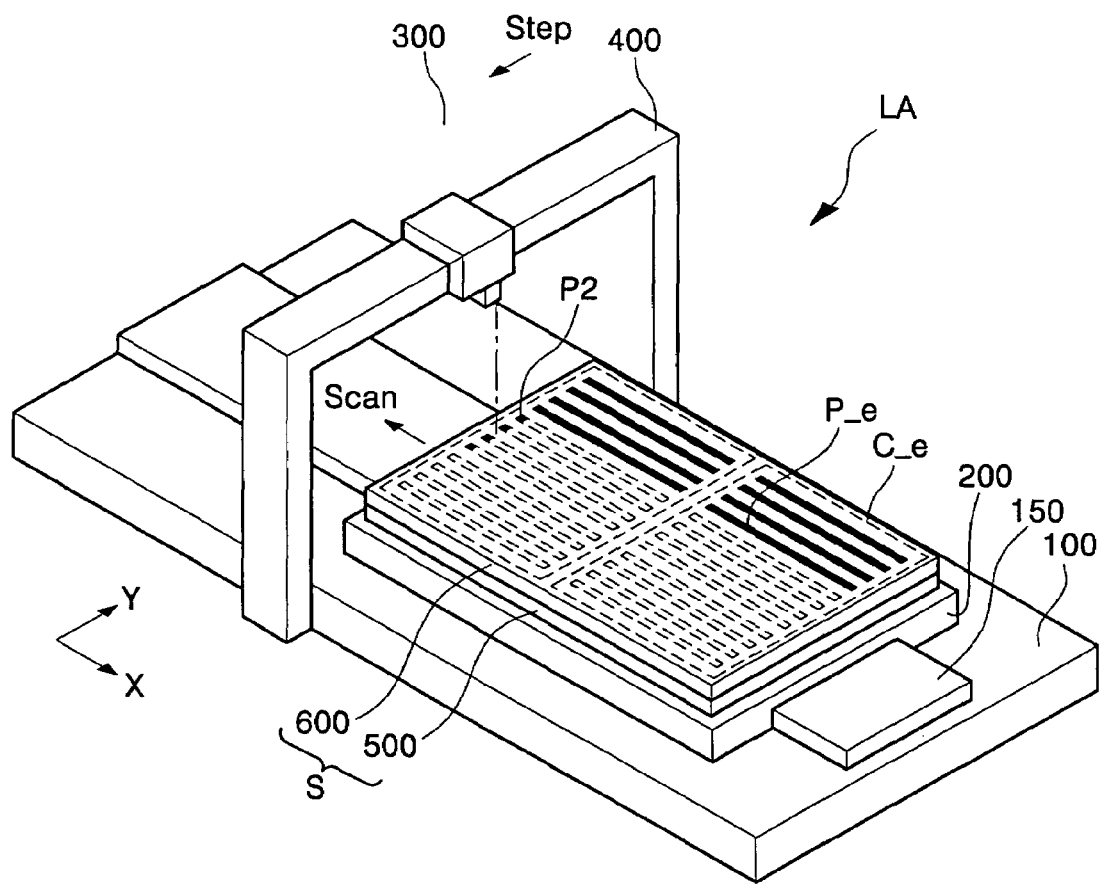
Figure 8C:
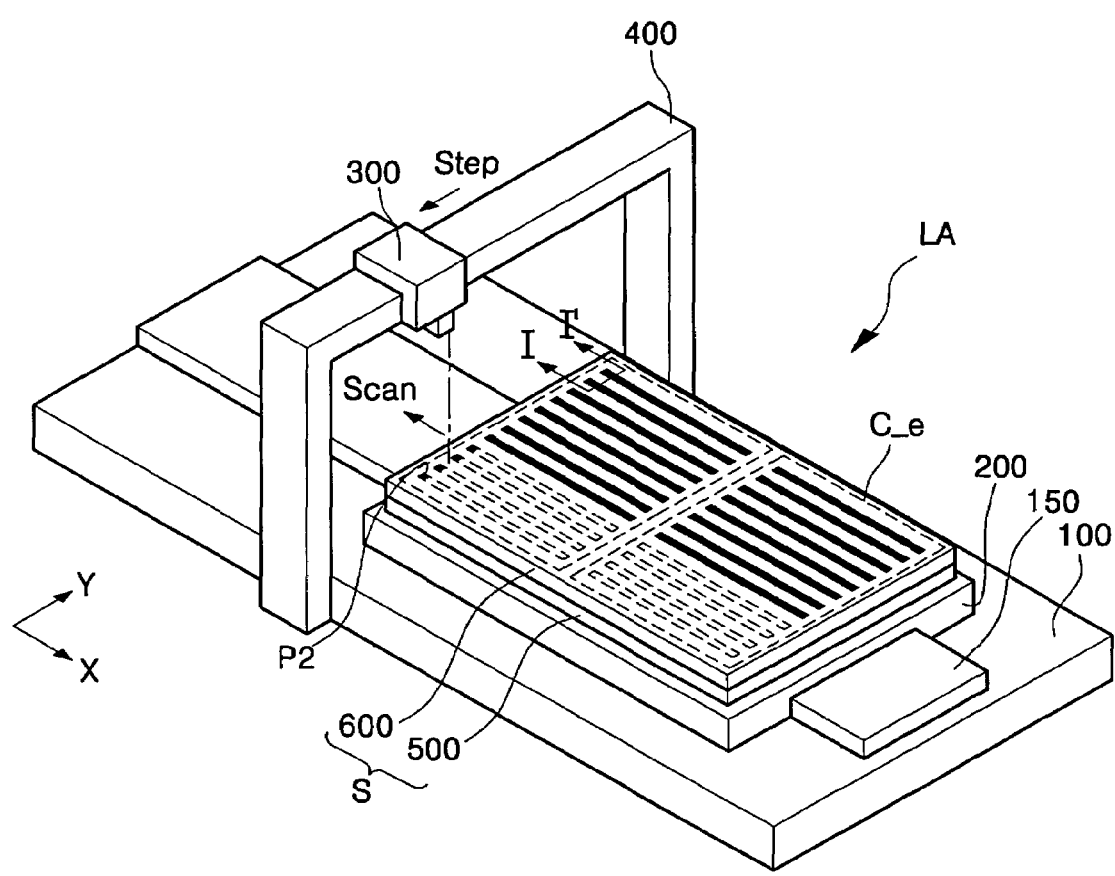
Figure 9:
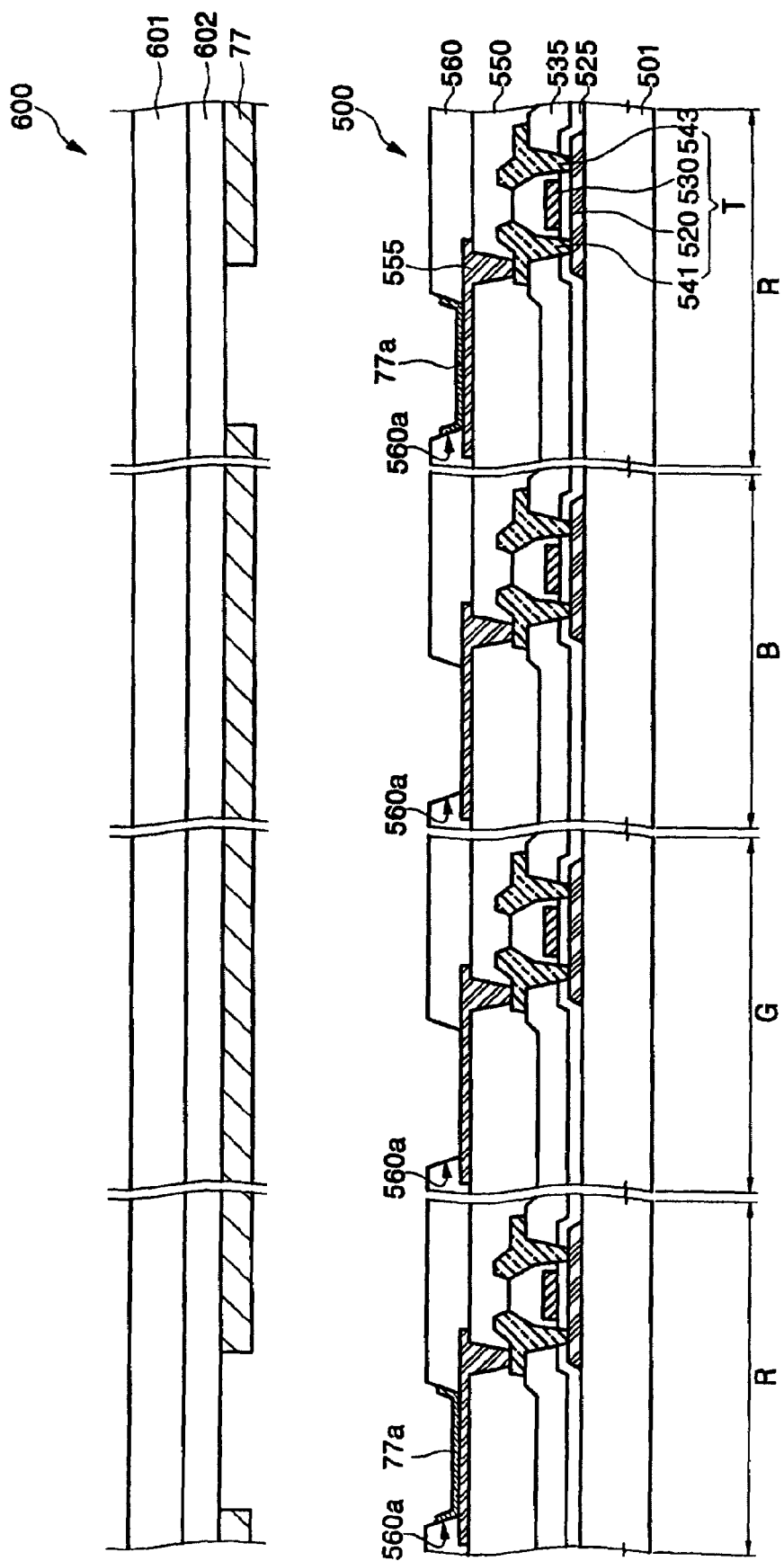
FIG. 9 is a cross-sectional view of the OLED taken along line I-I' of FIG. 7C or FIG. 8C.

FIGS. 7A, 7B and 7C are perspective views illustrating a method of fabricating an organic light emitting display (OLED) using the LITI apparatus of FIG. 1, including the above-described optical system, while FIG. 9 is a cross-sectional view of the OLED taken along line I-I' of FIG. 7C or FIG. 8C.

Referring to FIG. 7A, a substrate S is mounted on a chuck 200 of an LITI apparatus LA, which is the same as described with reference to FIG. 1. The substrate S may include an acceptor substrate 500 and a donor substrate 600, wherein the donor substrate 600 is laminated onto the acceptor substrate 500.

Referring to FIG. 9, the donor substrate 600 includes a base substrate 601, a light-to-heat conversion (LTHC) layer 602 disposed on the base substrate 601, and a transfer layer 77 disposed on the LTHC layer 602. The acceptor substrate 500 is a substrate for an OLED on which at least a pixel electrode 555 is formed. The transfer layer 77 of the donor substrate 600 is laminated on the acceptor substrate 500 such that it faces the pixel electrode 555 of the acceptor substrate 500.

Referring back to FIG. 7A, a plurality of OLED cell outlines C_e and a plurality of patterns P_e to be patterned on the acceptor substrate 500 are illustrated on the substrate S. A lengthwise direction of the patterns P_e to be patterned on the acceptor substrate 500 is parallel to a Y-axis direction (i.e., a widthwise direction of the substrate S). However, the OLED cell outlines C_e and the patterns P_e are not actually disposed but are illustrated for clarity of explanation.

Thereafter, laser beams are irradiated by the optical system 300. The optical system 300 is the same as described with reference to FIG. 2. Specifically, the image direction modulator 340 of FIG. 2 of the optical system 300 operates in the first mode. Thus, the optical system 300 irradiates laser beams having an X-axis image, and the beams irradiated by the optical system 300 form a transfer layer pattern P1 (element 77a of FIG. 9) on the acceptor substrate 500. Specifically, the laser beams irradiated by the optical system 300 are absorbed in the LTHC layer 602 of FIG. 9 of the donor substrate 600, and thus the LTHC layer 602 produces heat. Due to the heat produced by the LTHC layer 602, the transfer layer 77 adjacent to the LTHC layer 602 is transferred onto the acceptor substrate 500 so that the above-described transfer layer pattern P1 (element 77a of FIG. 9) is formed.

Thereafter, the optical system 300 (FIG. 7A) moves along an optical guide bar 400 in the −Y-axis direction at a predetermined speed. Thus, the laser beams irradiated by the optical system 300 are scanned onto the substrate S in a Y-axis direction.

Referring to FIG. 7B, due to the scanning of the laser beams onto the substrate S in the Y-axis direction, a set of transfer layer patterns P1 are completed on the substrate S.

Subsequently, the chuck 300 moves a step along a chuck guide bar 150 in the −X-axis direction, and laser beams are scanned onto the substrate S in the same manner as described above.

Referring to FIG. 7C, the beam scanning process and the stepwise movement of the chuck 300 are alternately repeated, thereby completing all transfer layer patterns P1 on the acceptor substrate 500.

FIGS. 8A, 8B and 8C are perspective views illustrating another method of fabricating an OLED using the LITI apparatus of FIG. 1 having the above-described optical system. Unlike the method described above with reference to FIGS. 7A, 7B and 7C, the present method is used when an image direction modulator of the optical system operates in the second mode.

Referring to FIG. 8A, a substrate S is mounted on a chuck 200. A lengthwise direction of patterns P_e to be patterned on an acceptor substrate 500 of the substrate S is an X-axis direction (i.e., a lengthwise direction of the substrate S).

Thereafter, laser beams are irradiated by the optical system 300. The optical system 300 is the same as described with reference to FIG. 4. Specifically, the image direction modulator 340 of FIG. 4 of the optical system 300 operates in the second mode. Thus, the laser beams irradiated by the optical system 300 have a Y-axis image and form a transfer layer pattern P2 on the acceptor substrate 500.

Thereafter, the chuck 200 moves along a chuck guide bar 150 in the −X-axis direction at a predetermined speed. As a result, the laser beams irradiated by the optical system 300 are scanned on the substrate S in an X-axis direction.

Referring to FIG. 8B, due to the scanning of the laser beams onto the substrate S in the X-axis direction, a set of transfer layer patterns P2 are completed on the substrate S.

Subsequently, the optical system 300 moves a step along an optical system guide bar 400 in the −Y-axis direction, and the laser beams are scanned onto the substrate S in the same manner as described above.

Referring to FIG. 8C, the beam scanning process and the stepwise movement of the optical system 300 are alternately repeated, thereby completing all transfer layer patterns P2 on the acceptor substrate 500.

FIG. 9 is a cross-sectional view of the OLED taken along line I-I' of FIG. 7C or FIG. 8C.

Referring to FIG. 9, a semiconductor layer 520 is disposed on a substrate 501 including a red region R, a green region G, and a blue region B. The semiconductor layer 520 may be an amorphous silicon (a-Si) layer or a polysilicon (poly-Si) layer obtained by crystallizing the a-Si layer. A gate insulating layer 525 is disposed on the semiconductor layer 520. A gate electrode 530 is disposed on the gate insulating layer 525 so that it overlaps the semiconductor layer 520. A first interlayer insulating layer 535 is disposed on the gate electrode 530 so as to cover the semiconductor layer 520 and the gate electrode 530. A drain electrode 541 and a source electrode 543 are disposed on the first interlayer insulating layer 535. The drain electrode 541 and source electrode 543 are connected to both edge portions of the semiconductor layer 520, respectively, through the first interlayer insulating layer 535 and the gate insulating layer 525. The semiconductor layer 520, the gate electrode 530, and the drain and source electrodes 541 and 543, respectively, constitute a thin-film transistor T. A second interlayer insulating layer 550 covers the drain and source electrodes 541 and 543, respectively. The second interlayer insulating layer 550 may include a passivation layer for protecting the thin-film transistor T and a planarization layer for reducing a step caused by the thin-film transistor T. A pixel electrode 555 is disposed on the second interlayer insulating layer 550. The pixel electrode 555 is connected to the drain electrode 541 through the second interlayer insulating layer 550. The pixel electrode 555 may be, for example, an indium tin oxide (ITO) layer or an indium zinc oxide (IZO) layer. A pixel defining layer 560 may be disposed on the pixel electrode 555. The pixel defining layer 560 has an opening 560a, which exposes a portion of the pixel electrode 555.

Meanwhile, the donor substrate 600 includes a base substrate 601, an LTHC layer 602 and a transfer layer 77, which are sequentially laminated on the base substrate 601. The transfer layer 77 may be an organic emission layer. Furthermore, the transfer layer 77 may include at least one selected from the group consisting of an organic hole injection layer, an organic hole transport layer, an organic hole blocking layer, an organic electron transport layer, and an organic electron injection layer.

A portion of the transfer layer 77 is transferred onto the pixel electrode 555 of the acceptor substrate 500, thereby forming a transfer layer pattern 77a. The transfer layer pattern 77a may be an organic emission layer. Also, the transfer layer pattern 77a may include at least one selected from the group consisting of a hole injection layer, a hole transport layer, a hole blocking layer, an electron transport layer, and an electron injection layer.

According to the exemplary embodiments of the present invention as described above, an optical system includes an image direction modulator which modulates an image direction of laser beams relative to different directions from each other, i.e., an X-axis direction and a Y-axis direction. Hence, emission patterns may be formed in different directions without changing a chuck or optical system, and without exchanging LITI apparatuses.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A laser induced thermal imaging apparatus, comprising an optical system which includes:
    a laser source for producing laser beams; and
    an image direction modulator having a first mode in which an image direction of the laser beams is modulated relative to a first direction and a second mode in which the image direction of the laser beams is modulated relative to a second direction;
    said apparatus further comprising an optical system guide bar on which said optical system is slidably mounted for movement in a first one of said first direction and said second direction; and
    said apparatus further comprising a chuck disposed facing to and spaced apart from the optical system for mounting a substrate, and a chuck guide bar disposed opposite to and spaced apart from the optical system guide bar, said chuck being slidably mounted on said chuck guide bar for movement in a second one of said first direction and said second direction, with the second one of said first direction and said second direction being different from the first one of said first direction and said second direction.

2. The system according to claim 1, wherein the first direction is an X-axis direction, and the second direction is a Y-axis direction.

3. The system according to claim 1, wherein the image direction modulator includes a first beam passage corresponding to the first mode and a second beam passage corresponding to the second mode.

4. The system according to claim 3, wherein each of the first and second beam passages comprises reflecting mirrors.

5. The system according to claim 1, further comprising an image transformer disposed between the laser source and the image direction modulator, the image transformer transforming an image of the laser beams produced by the laser source into a line shape.

6. The system according to claim 5, wherein the image transformer comprises a homogenizer.

7. The system according to claim 5, further comprising a mask disposed between the image transformer and the image direction modulator, the mask including one of a light transmission pattern and a light reflection pattern.

8. A laser induced thermal imaging apparatus, comprising:
    an optical system including a laser source for producing laser beams, an image direction modulator for modulating an orientation of an image of the laser beams, and a projection lens;
    a chuck disposed facing to and spaced apart from the optical system, the chuck for mounting a substrate;
    an optical system guide bar disposed opposite to and spaced apart from the chuck, said optical system being slidably mounted on said optical system guide bar for movement in a first direction; and
    a chuck guide bar disposed below the optical system guide bar, said chuck being slidably mounted on said chuck guide bar for movement in a second direction.

9. The apparatus according to claim 8, wherein the image direction modulator has a first mode in which the orientation of the image direction of the laser beams is modulated relative to a first direction and a second mode in which the image direction of the laser beams is modulated relative to a second direction.

10. The apparatus according to claim 9, wherein the first direction is an X-axis direction, and the second direction is a Y-axis direction.

11. The apparatus according to claim 9, wherein the image direction modulator includes a first beam passage corresponding to the first mode and a second beam passage corresponding to the second mode.

12. The apparatus according to claim 11, wherein each of the first and second beam passages comprise reflecting mirrors.

13. The apparatus according to claim 8, further comprising an image transformer disposed between the laser source and the image direction modulator, the image transformer transforming an image of the laser beams produced by the laser source into a line shape.

14. The apparatus according to claim 13, wherein the image transformer comprises a homogenizer.

15. The apparatus according to claim 13, further comprising a mask disposed between the image transformer and the image direction modulator, the mask including one of a light transmission pattern and a light reflection pattern.

16. The apparatus according to claim 8, wherein the projection lens is disposed between the laser source and the image direction modulator.

17. The apparatus according to claim 8, wherein the projection lens projects the laser beams outputted by the image direction modulator onto the substrate.

18. A laser inducted thermal imaging apparatus comprising:
    an optical system including a laser source for producing laser beams, an image direction modulator for modulating an orientation of an image formed by the laser beams, and a projection lens;
    a chuck disposed facing to and spaced apart from the optical system, and the chuck for mounting a substrate;
    an optical system guide bar disposed opposite to and spaced apart from the chuck, said optical system being slidably mounted on said optical system guide bar for movement in a first direction; and
    a chuck guide bar disposed below the optical system guide bar, said chuck being slidably mounted on said chuck guide bar for movement in a second direction;
    wherein the optical system and the chuck are capable of moving in vertical directions relative to each other.

19. An optical system of a laser induced thermal imaging apparatus, comprising:
    a laser source for producing laser beams which form a pattern image; and
    an image direction modulator performing a first mode in which an orientation of the pattern image is modulated to a first direction and a second mode in which the orientation of the pattern image is modulated to a second direction.

* * * * *